US009806253B2

United States Patent
Apalkov et al.

(10) Patent No.: US 9,806,253 B2
(45) Date of Patent: Oct. 31, 2017

(54) METHOD FOR PROVIDING A HIGH PERPENDICULAR MAGNETIC ANISOTROPY LAYER IN A MAGNETIC JUNCTION USABLE IN SPIN TRANSFER TORQUE MAGNETIC DEVICES USING MULTIPLE ANNEALS

(71) Applicant: Samsung Electronics Co., LTD., Gyeonggi-do (KR)

(72) Inventors: Dmytro Apalkov, San Jose, CA (US); Dustin William Erickson, Morgan Hill, CA (US); Vladimir Nikitin, Campbell, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/066,721

(22) Filed: Mar. 10, 2016

(65) Prior Publication Data

US 2017/0141296 A1     May 18, 2017

Related U.S. Application Data

(60) Provisional application No. 62/256,020, filed on Nov. 16, 2015.

(51) Int. Cl.
  *H01L 43/00*     (2006.01)
  *H01L 43/08*     (2006.01)
  (Continued)

(52) U.S. Cl.
  CPC ............ *H01L 43/08* (2013.01); *G11C 11/161* (2013.01); *H01L 43/02* (2013.01); *H01L 43/10* (2013.01); *H01L 43/12* (2013.01)

(58) Field of Classification Search
  CPC .............. G01R 33/098; G01R 33/1284; G01R 33/093; G11B 5/3909; G11C 11/02;
  (Continued)

(56) References Cited

U.S. PATENT DOCUMENTS 4,701,349 A   10/1987 Koyanagi
4,743,569 A   5/1988 Plumton
(Continued)

FOREIGN PATENT DOCUMENTS

CN      102978590      3/2013

OTHER PUBLICATIONS

Rao, Mulpuri V. and Thompson, Phillip E., "Two-step rapid thermal annealing of Siimplanted InP:Fe," Applied Phys. Letters, 50, 1444 (1987).

(Continued)

*Primary Examiner* — Edward Chin
(74) *Attorney, Agent, or Firm* — Convergent Law Group LLP (57) ABSTRACT

A method for providing a magnetic junction usable in a magnetic device and the magnetic junction are described. The method includes providing a free layer, a pinned layer and a nonmagnetic spacer layer between the free layer and the pinned layer. The free layer is switchable between stable magnetic states when a write current is passed through the magnetic junction. At least one of the steps of providing the free layer and providing the pinned layer includes providing magnetic and sacrificial layers and performing two anneals of the sacrificial and magnetic layers. The magnetic layer includes a glass-promoting component and is amorphous as-deposited. The first anneal is at a first temperature exceeding 300 degrees Celsius and not exceeding 450 degrees Celsius. The second anneal is at a second tempera-
(Continued)

ture greater than the first temperature and performed after the first anneal. The sacrificial layer is removed.

13 Claims, 8 Drawing Sheets

(51) Int. Cl.
  *H01L 43/12* (2006.01)
  *H01L 43/02* (2006.01)
  *H01L 43/10* (2006.01)
  *G11C 11/16* (2006.01)

(58) Field of Classification Search
  CPC ... G11C 11/15; G11C 11/161; G11C 11/1675; H01F 10/14; H01F 10/16; H01L 43/02; H01L 43/08; H01L 43/10; H01L 43/12; Y10T 428/1114; Y10T 428/1121; Y10T 428/1143
  USPC .......... 365/158, 171, 173; 428/811.1, 811.2, 428/811.5
  See application file for complete search history.

(56) References Cited

U.S. PATENT DOCUMENTS

| | | |
|---|---|---|
| 4,851,358 A | 7/1989 | Huber |
| 5,686,359 A | 11/1997 | Meester |
| 5,953,633 A | 9/1999 | Chen |
| 5,970,370 A | 10/1999 | Besser |
| 6,071,782 A | 6/2000 | Maa |
| 6,091,152 A | 7/2000 | Iwata |
| 6,110,789 A | 8/2000 | Rhodes |
| 6,265,271 B1 | 7/2001 | Thei |
| 6,403,474 B1 | 6/2002 | Avanzino |
| 6,410,429 B1 | 6/2002 | Ho |
| 5,194,405 A1 | 9/2003 | Wang |
| 6,656,836 B1 | 12/2003 | Wang |
| 7,105,429 B2 | 9/2006 | Jawarani |
| 7,795,124 B2 | 9/2010 | Nouri |
| 8,758,909 B2 * | 6/2014 | Shukh .................. G11B 5/3909 365/158 |
| 9,368,176 B2 * | 6/2016 | Shukh .................. G11C 11/161 |
| 9,373,777 B2 * | 6/2016 | Jan ....................... G01R 33/098 |
| 9,384,811 B2 * | 7/2016 | Apalkov ................. H01L 43/08 |
| 2014/0175578 A1 * | 6/2014 | Chan ..................... H01L 43/08 257/421 |
| 2014/0252515 A1 | 9/2014 | Lai |

OTHER PUBLICATIONS

J. A. López-Rubio, J. Sangrador, M. Clement, T. Rodríguez, "Multi-step rapid thermal annealing of boron and indium implanted Hg1-xCdxTe," Journal of Electronic Materials Nov. 1994, vol. 23, Issue 11, pp. 1245-1249.

Kwang S. Seo, Sunanda Dhar and Pallab K. Bhattacharya, "High-quality Si-implanted GaAs activated by a two-step rapid thermal annealing technique," Applied Phys. Letters, 47, 500 (1985).

* cited by examiner

METHOD FOR PROVIDING A HIGH PERPENDICULAR MAGNETIC ANISOTROPY LAYER IN A MAGNETIC JUNCTION USABLE IN SPIN TRANSFER TORQUE MAGNETIC DEVICES USING MULTIPLE ANNEALS

CROSS-REFERENCE TO RELATED APPLICATIONS

This application claims the benefit of provisional Patent Application Ser. No. 62/256,020, filed Nov. 16, 2015, entitled "TWO STEP RTA", assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers. The pinned layer and free layer may have their magnetizations oriented perpendicular to the plane of the layers (perpendicular-to-plane) or in the plane of the layers (in-plane).

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A method for providing a magnetic junction usable in a magnetic device and the magnetic junction are described. The method includes providing a free layer, a pinned layer and a nonmagnetic spacer layer between the free layer and the pinned layer. The free layer is switchable between stable magnetic states when a write current is passed through the magnetic junction. At least one of the steps of providing the free layer and providing the pinned layer includes providing a magnetic layer including a glass-promoting component, providing a sacrificial layer on the magnetic layer and performing two anneals of the sacrificial and magnetic layers. The magnetic layer is amorphous as-deposited. The first anneal is at a first temperature greater than 300 degrees Celsius and not more than 450 degrees Celsius. The magnetic layer is at least partially crystallized after the first anneal. The second anneal is at a second temperature greater than the first temperature and is performed after the first anneal. The sacrificial layer is removed.

DETAILED DESCRIPTION OF THE INVENTION

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide a method for providing a magnetic junction usable in a magnetic device and the magnetic junction. The method includes providing a free layer, a pinned layer and a nonmagnetic spacer layer between the free layer and the pinned layer. The free layer is switchable between stable magnetic states when a write current is passed through the magnetic junction. At least one of the steps of providing the free layer and providing the pinned layer includes providing a magnetic layer including a glass-promoting component, providing a sacrificial layer on the magnetic layer and performing two anneals of the sacrificial and magnetic layers. The magnetic layer is amorphous as-deposited. The first anneal is at a first temperature greater than 300 degrees Celsius and not more than 450 degrees Celsius. The magnetic layer is at least partially crystallized after the first anneal. The second anneal is at a second temperature greater than the first temperature and is performed after the first anneal. The sacrificial layer is removed.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 1:
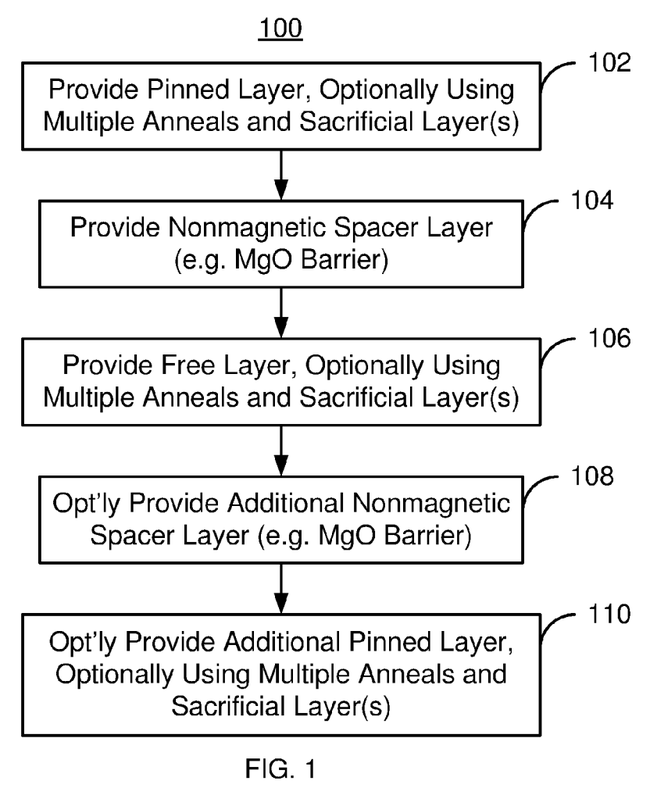
FIG. 1 is a flow chart depicting an exemplary embodiment of a method for providing a magnetic junction usable in a magnetic memory and programmable using spin transfer torque.

FIG. 1 depicts an exemplary embodiment of a method 100 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 100 may start after other steps in forming a magnetic memory have been performed. The method 100 is also described in the context of forming a single magnetic junction. However, multiple magnetic junctions may be formed substantially simultaneously.

A pinned layer is provided, via step 102. The pinned layer is magnetic and may have its magnetization pinned, or fixed, in a particular direction during at least a portion of the operation of the magnetic junction. The pinned layer may thus be thermally stable at operating temperatures. The pinned layer formed in step 102 may be a simple (single) layer or may include multiple layers. For example, the pinned layer formed in step 102 may be a synthetic antiferromagnet (SAF) including magnetic layers antiferromagnetically or ferromagnetically coupled through thin nonmagnetic layer(s), such as Ru. In such a SAF, each magnetic layer may also include multiple layers. The pinned layer may also be another multilayer. The pinned layer formed in step 102 may have a perpendicular anisotropy energy that exceeds the out-of-plane demagnetization energy. Thus, the pinned layer may have its magnetic moment oriented perpendicular to plane. Other orientations of the magnetization of the pinned layer are possible.

The pinned layer may be deposited on seed layer(s) if the magnetic junction being formed is a bottom pinned magnetic junction or a dual magnetic junction. The seed layer(s) may be selected for various purposes including but not limited to the desired crystal structure of the pinned layer, magnetic anisotropy and/or other magnetic characteristics of the pinned layer. For example, the pinned layer may be provided on a seed layer such as a crystalline MgO layer that promotes a perpendicular magnetic anisotropy in the pinned layer. If a top pinned magnetic junction is being fabricated, the pinned layer may be formed on a nonmagnetic spacer layer, described below. In such an embodiment, the free layer formed in step 106 is provided first. In some embodiments, the perpendicular magnetic anisotropy energy of the pinned layer formed in step 106 may exceed the out-of-plane demagnetization energy. Thus, the magnetic moment of the pinned layer may be out-of-plane. For example, the magnetic moment may be perpendicular to plane.

Providing the pinned layer in step 102 may include multiple steps used in forming a crystalline magnetic layer. For example, a magnetic layer including at least one glass-promoting component may be deposited. The magnetic layer is amorphous as-deposited. A single glass-promoting component in the magnetic layer is described herein. However, multiple glass-promoting components may be used in other embodiments. For example, a CoFeB or FeB layer may be deposited. The CoFeB layer may be a $(CoFe)_{1-x}B_x$ layer, where x is at least 0.2 and not more than 0.5. Such a CoFeB layer is amorphous as deposited. In such a layer, B is the glass-promoting component. As used herein, a CoFeB layer has the stoichiometry in the range described above. Other magnetic layers and/or other glass-promoting components may be used.

A sacrificial layer is deposited on the magnetic layer. The sacrificial layer has a high affinity for the glass-promoting component. For the CoFeB layer in the example above, Ta and W have a high affinity for B. The sacrificial layer may thus include Ta and/or W. In some embodiments, the sacrificial layer consists of a Ta layer. In other embodiments, the sacrificial layer is a W layer. Other materials are, however, possible. For example, Hf, Rb, Sc, Zr, Nb, Mg, V, Mn, Ag, Be, Mo, Ti, Cr, Al and/or Te can be used in the sacrificial layer in addition to or in lieu of Ta and W.

At least two anneals are performed on the magnetic and sacrificial layers. One or both of the anneals may be a rapid thermal anneal (RTA). The first anneal is at a first temperature of greater than 200 degrees Celsius and not exceeding 475 degrees Celsius. In some embodiments, the first temperature is not less than 300 degrees Celsius. As used herein, a temperature of an anneal may be considered to indicate a target temperature for the anneal. The actual temperature of the layers and the temperature of the environment surrounding the layers may deviate somewhat from the anneal temperature. The magnetic layer is at least partially crystallized after the first anneal. Stated differently, part of the magnetic layer has a crystalline structure, such as body-centered cubic. The remaining portion of the magnetic layer is amorphous.

A second anneal of the magnetic layer and the sacrificial layer is performed after the first anneal. In some embodiments, the sacrificial layer is removed after the first anneal and before the second anneal. In such embodiments, a second sacrificial layer is deposited after removal of the sacrificial layer but before the second anneal. The second sacrificial layer is analogous to the first sacrificial layer. For example, the second sacrificial layer may include or be selected from Ta, Hf, Rb, Sc, Zr, Nb, Mg, V, Mn, Ag, Be, Mo, Ti, Cr, Al, Te and W. The second anneal is at a second temperature greater than the temperature of the first anneal. The second temperature may be greater than 400 degrees Celsius and not exceeding 575 degrees Celsius.

The magnetic layer may be fully crystallized after the second anneal. As used herein, fully crystallized is at least 75% crystalline and not more than 25% amorphous. In some embodiments, fully crystallized is at least 90% crystalline. As used herein, the "crystal structure" of the "fully crystallized" layer is the crystal structure of the crystalline portion of the fully crystallized layer. The crystal structure of the magnetic layer may match that of the underlying layer. The glass-promoting component may also further diffuse into the sacrificial layer. The ongoing crystallization of the magnetic layer may prevent or reduce diffusion of the sacrificial layer into the magnetic layer. Thus, the magnetic layer may be substantially free of the glass-promoting component. In some embodiments, not all of the glass-promoting component diffuses out of the magnetic layer. In other embodiments, the percentage of the glass-promoting component is significantly decreased. In some embodiments, additional anneals may be performed for the magnetic layer. In other embodiments, only two anneals are performed for this layer. The magnetic junction may, however, undergo further heat treatments as part of the fabrication process.

The remaining sacrificial layer is also removed. If the first sacrificial layer had not been removed between the anneals, then it is removed after the second anneal. If the first sacrificial layer had been removed after the first anneal, then the additional sacrificial layer is deposited before the second anneal and subsequently removed after the second anneal. In addition, it is noted that other layers, such as a polarization enhancement layer (PEL) or coupling layer(s) may be provided as part of step 102. Thus, the magnetic layer formed as described above may be part of all of the pinned layer.

A nonmagnetic spacer layer is provided, via step 104. In some embodiments, a crystalline MgO tunneling barrier layer may be desired for the magnetic junction being formed. Step 104 may include depositing MgO, which forms a tunneling barrier layer. In some embodiments, step 104 may include depositing MgO using, for example, radio frequency (RF) sputtering. Metallic Mg may be deposited, then oxidized in step 104 to provide a natural oxide of Mg. The MgO barrier layer/nonmagnetic spacer layer may also be formed in another manner. Step 104 may include annealing the portion of the magnetic junction already formed to provide crystalline MgO tunneling barrier with a (100) orientation for enhanced tunneling magnetoresistance (TMR) of the magnetic junction.

A free layer is provided, via step 106. Step 106 includes depositing the material(s) for the free layer. The free layer may be deposited on seed layer(s) if the magnetic junction being formed is a top pinned magnetic junction. The seed layer(s) may be selected for various purposes including but not limited to the desired crystal structure of the free layer, magnetic anisotropy and/or magnetic damping of the free layer. For example, the free layer may be provided on a seed layer such as a crystalline MgO layer that promotes a perpendicular magnetic anisotropy in the free layer. If a dual magnetic junction or bottom pinned magnetic junction is fabricated, the free layer may be formed on a nonmagnetic spacer layer. Thus, steps 102, 104 and 106 may be performed in that order or in reverse order (steps 106, 104 and 102).

The free layer provided in step 106 may be desired to have a perpendicular magnetic anisotropy that exceeds its demagnetization energy. The magnetic moment of the free layer may thus be stable out-of-plane, including perpendicular-to-plane. In addition, a PEL may be provided as part of or in addition to the free layer. A PEL includes high spin polarization materials. The free layer provided in step 106 is also configured to be switched between stable magnetic states when a write current is passed through the magnetic junction. Thus, the free layer is switchable utilizing spin transfer torque. The free layer provided in step 106 is magnetic and thermally stable at operating temperatures.

Formation of the free layer in step 106 may optionally include forming a magnetic layer in a manner analogous to what is described above for the pinned layer. Thus, step 106 may include providing a magnetic layer including at least one glass-promoting component, providing a sacrificial layer, performing two or more anneals as described above and removing the sacrificial layer. In some embodiments, the sacrificial layer is removed between the two anneals and a new sacrificial layer deposited. In other embodiments, the sacrificial layer is removed after the second anneal. The free layer provided in step 106 may be partially or fully formed by the magnetic layer described above. Thus, step 102 only, step 106 only, or both steps 102 and 106 may include the use of multiple anneals and at least one sacrificial layer as described above.

An additional nonmagnetic spacer layer may optionally be provided, via step 108. Step 108 is performed if a dual magnetic junction is desired to be fabricated. If a single magnetic junction is desired, then step 108 is omitted. In some embodiments, an additional crystalline MgO tunneling barrier layer may be desired for the magnetic junction being formed. Step 108 may thus be performed as described above with respect to step 104.

An additional pinned layer may optionally be provided, via step 110. Step 110 is performed if a dual magnetic junction is desired to be fabricated. If a single magnetic junction is desired, then step 110 is omitted. In some embodiments, the perpendicular magnetic anisotropy energy exceeds the out-of-plane demagnetization energy for the pinned layer formed in step 110. Step 110 may include steps that are analogous to those performed in step 102 and 106. Thus, step 110 may include providing a magnetic layer including at least one glass-promoting component, providing a sacrificial layer, performing at least two anneals as described above and removing the sacrificial layer. In some embodiments, the sacrificial layer is removed between the two anneals and a new sacrificial layer deposited. In other embodiments, the sacrificial layer is removed after the second anneal. The magnetic layer described above may thus form part or all of the additional pinned layer formed in step 110. In other embodiments, step 110 may be performed in a different manner.

Fabrication of the magnetic junction may then be completed. For example, the capping layer(s) may be deposited and the edges of the magnetic junction defined, for example by providing a mask on the layers that have been deposited and ion milling the exposed portions of the layers. Additional structures, such as contacts and conductive lines may also be formed for the device in which the magnetic junction is used.

Figure 2:
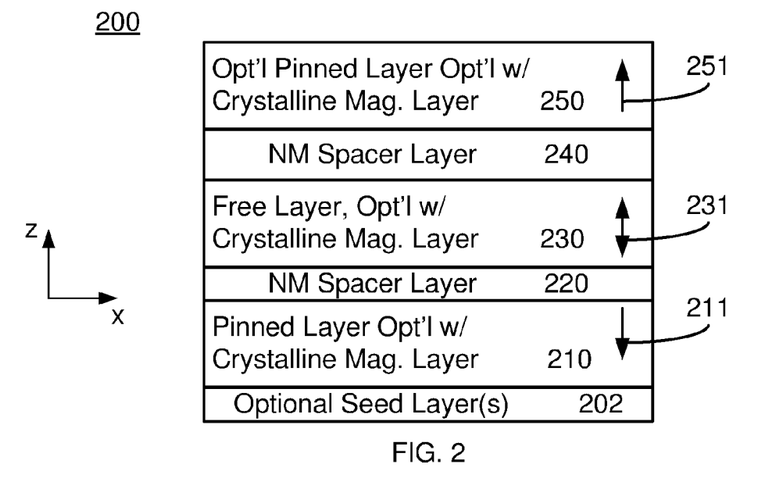
FIG. 2 depicts an exemplary embodiment of a magnetic junction usable in a magnetic memory programmable using spin transfer torque.

FIG. 2 depicts an exemplary embodiment of a magnetic junction 200 that may be fabricated using the method 100. For clarity, FIG. 2 is not to scale. The magnetic junction 200 may be used in a magnetic device such as a STT-RAM and, therefore, in a variety of electronic devices. The magnetic junction 200 includes seed layer(s) 202, a pinned layer 210 having a magnetic moment 211, a nonmagnetic spacer layer 220, a free layer 230 having magnetic moment 231, an optional additional nonmagnetic spacer layer 240, and an optional additional pinned layer 250 having magnetic moment 251. A bottom contact, top contact and optional capping layer(s) are not shown. As can be seen in FIG. 2, the magnetic junction 200 is a dual magnetic junction. In another embodiment, the additional nonmagnetic spacer layer 240 and additional pinned layer 250 might be omitted. If the pinned layer 210 is closest to the substrate in such a case, then the magnetic junction 200 is a bottom pinned magnetic junction. Alternatively, the free layer 230 could be closer to the substrate than the pinned layer 210. In such an embodiment, the magnetic junction 200 is a top pinned magnetic junction. Also in this embodiment, the free layer 230 may adjoin the seed layer(s) 202. Optional pinning layer(s) (not shown) may be used to fix the magnetization of the pinned layer(s) 210 and/or 250. In some embodiments, the optional pinning layer may be an AFM layer or multilayer that pins the magnetization(s) 211 and/or 251 by an exchange-bias interaction. However, in other embodiments, the optional pinning layer may be omitted or another structure may be used.

In the embodiment shown in FIG. 2, the perpendicular magnetic anisotropy energies of the pinned layers 210 and 250 and of the free layer 230 each exceeds the out of plane demagnetization energies of the pinned layers 210 and 250 and free layer 230, respectively. Consequently, the magnetic moments 211, 231 and 251 of the pinned layer 210, the free layer 230 and the pinned layer 250, respectively, may be perpendicular to plane. Stated differently, the stable magnetic states for the free layer 231 may be with the moment oriented in the +z direction or the −z direction.

The magnetic junction 200 is also configured to allow the free layer 230 to be switched between stable magnetic states when a write current is passed through the magnetic junction 200. Thus, the free layer 230 is switchable utilizing spin transfer torque when a write current is driven through the magnetic junction 200 in a current perpendicular-to-plane (CPP) direction. The data stored in the magnetic junction 200, and thus the direction of magnetization of the free layer 230, may be read by driving a read current through the magnetic junction 200. The read current may also be driven through the magnetic junction 200 in the CPP direction. Thus, the magnetoresistance of the magnetic junction 200 provides the read signal.

The magnetic junction 200 may have improved performance due to fabrication using the step(s) 102, 106 and/or 110. Use of the sacrificial insertion layer(s) and multiple anneals may allow for improved crystallization of the free layer 230 and/or pinned layer(s) 210 and/or 250. It is believed that this may be due at least in part to the use of two anneals having different temperatures in combination with the sacrificial layer(s) having an affinity for the glass-forming component. Further, the magnetic layers 210, 230 and/or 250 may have a high perpendicular magnetic anisotropy. The magnetic junction 200 may thus have a higher magnetoresistance. Performance may thus be improved.

Figure 3:
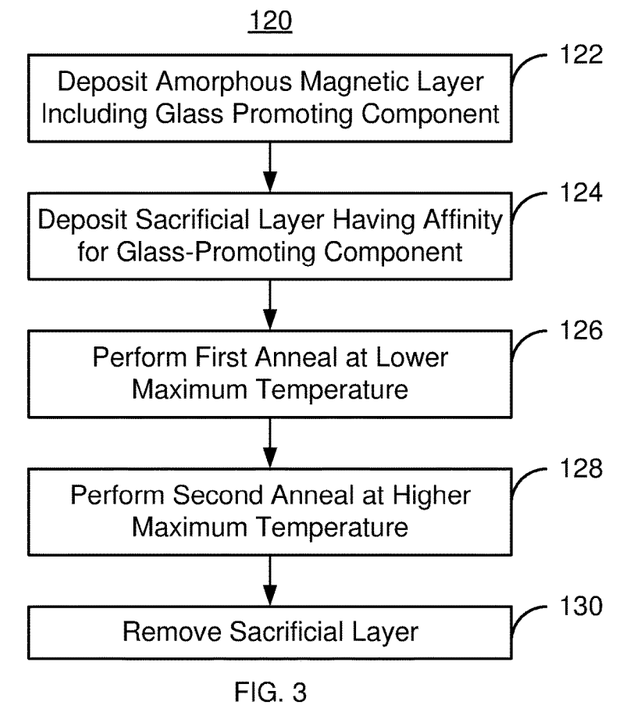
FIG. 3 is a flow chart depicting an exemplary embodiment of a method for providing a magnetic layer for a magnetic junction usable in a magnetic memory and programmable using spin transfer torque.
Figure 4:
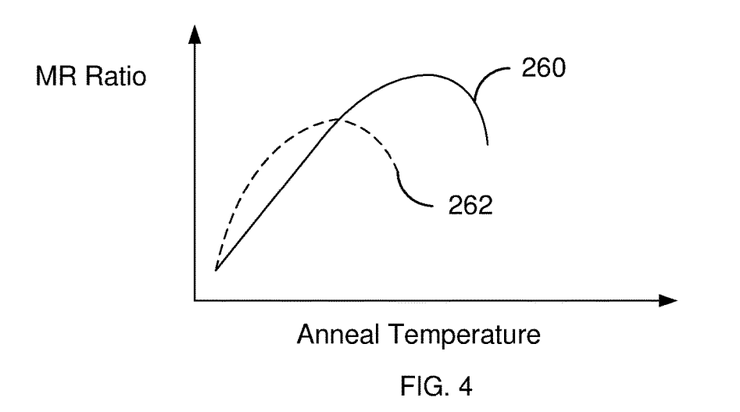
FIG. 4 depicts an exemplary embodiment of magnetoresistance ratio versus anneal temperature for a single anneal and two different sacrificial layers.

FIG. 3 depicts an exemplary embodiment of a method 120 for fabricating a portion of a magnetic junction usable in a magnetic device such as a STT-RAM and, therefore, in a variety of electronic devices. For simplicity, some steps may be omitted, performed in another order and/or combined. Further, the method 120 may start after other steps in forming a magnetic memory have been performed. The method 120 may be used in performing the step 102, 104 and/or 108 of the method 100. However, in other embodiments, the method 120 may be used in fabricating another portion of the magnetic junction 200, and/or may be used in connection with another fabrication process. FIG. 4 depicts the magnetoresistance ratio versus single anneal temperature. FIGS. 5-6 and 8-9 depict exemplary embodiments of a portion of the magnetic junction 270 being fabricated. For clarity, FIGS. 5-6 and 8-9 are not to scale. FIGS. 7A and 7B depict exemplary embodiments of temperature versus time for multiple anneals in the method 120.

Referring to FIGS. 3-9, the method 120 may start after other layer(s), such as seed layer(s), nonmagnetic spacer layer(s) or other layers have been formed. For example, in one embodiment, the method 120 commences after a crystalline MgO seed layer having a (100) orientation has been deposited or after a crystalline MgO tunneling barrier layer has been formed.

A magnetic layer including at least one glass-promoting component is provided, via step 122. The magnetic layer is amorphous as-deposited. A single glass-promoting component is described herein. However, multiple glass-promoting components may be used in other embodiments. For example, a CoFeB and/or FeB layer may be deposited. A CoFeB or FeB layer that is amorphous as-deposited and uses B as a glass-promoting component may be formed in step 122.

A sacrificial layer is deposited on the magnetic layer, via step 124. The sacrificial layer has a high affinity for the glass-promoting component. For the magnetic layer in the example above, Ta and W have a high affinity for the glass-promoting component B. The sacrificial layer may thus include Ta and/or W. In some embodiments, the sacrificial layer may consist of Ta. In other embodiments, the sacrificial layer may consist of W. Other materials that can be used include but may not be limited to one or more of the following: Hf, Rb, Sc, Zr, Nb, Mg, V, Mn, Ag, Be, Mo, Ti, Cr, Al, Te. The materials used in the sacrificial layer may thus be analogous to those used in fabricating a magnetic junction if a single anneal is used. If used in conjunction with a single anneal, Ta and W sacrificial layers may increase the magnetoresistance ratio. However, if the anneal temperature is sufficiently high, the magnetoresistance ratio starts to fall off. FIG. 4 depicts curves 260 and 262 indicating magnetoresistance ratio of a magnetic junction, such as the magnetic junction 200, for two different sacrificial layers used with a single anneal. Note that if these curves 260 and 262 corresponded to W and Ta, respectively, the peaks may occur near 450 degrees Celsius for W and near 350 degrees Celsius for Ta. Thus, anneals at higher temperatures may drastically reduce the magnetoresistance of the magnetic junction 200, which is undesirable. However, such materials may still be useful in the method 120 and, therefore, the method 100.

Figure 5:
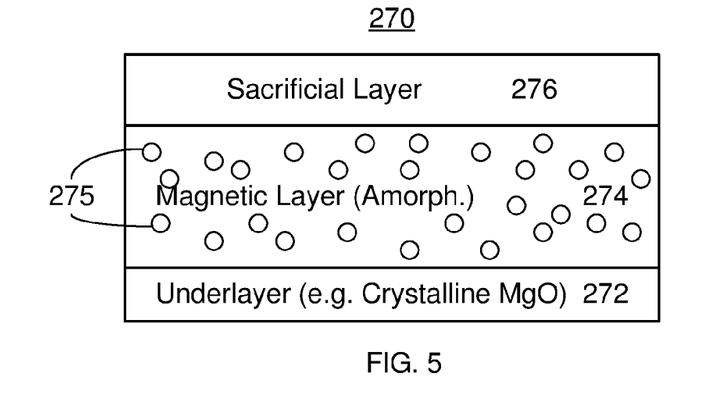
FIGS. 5-6 depict another exemplary embodiment of a magnetic layer for a magnetic junction usable in a magnetic memory and programmable using spin transfer torque during fabrication.

FIG. 5 depicts the portion of the magnetic junction 270 being formed using the method 120 after step 124 is performed. Thus, the magnetic layer 274 and sacrificial layer 276 are shown. The magnetic layer 274 resides on an underlayer 272. In some embodiments, the underlayer is a crystalline MgO layer having a (100) orientation. The magnetic layer is amorphous as-deposited and includes glass-promoting component 275. For simplicity, only two instances of the glass-promoting component 275 are labeled. The sacrificial layer 276 may be thin. For example, the sacrificial layer 276 may have a thickness of at least two Angstroms and not more than ten Angstroms. In some such embodiments, the sacrificial layer 276 has a thickness of at least four and not more than six Angstroms. Other thicknesses and/or other materials are, however, possible.

A first anneal is performed at a first temperature of greater than 200 degrees Celsius and not exceeding 475 degrees Celsius, via step 126. In some embodiments, the first temperature is not less than 300 degrees Celsius. The first anneal may be an RTA and may be performed for at least ten seconds and not more than one hour. For example, for a W sacrificial layer, the first temperature of the first anneal may not exceed 475 degrees Celsius. In some such embodiments, the first temperature may be nominally 450 degrees Celsius for a W sacrificial layer. In contrast, for a Ta sacrificial layer, the first temperature of the first anneal may not exceed 375 degrees Celsius. For example, the first temperature may be nominally 350 degrees Celsius for a Ta sacrificial layer.

Figure 6:
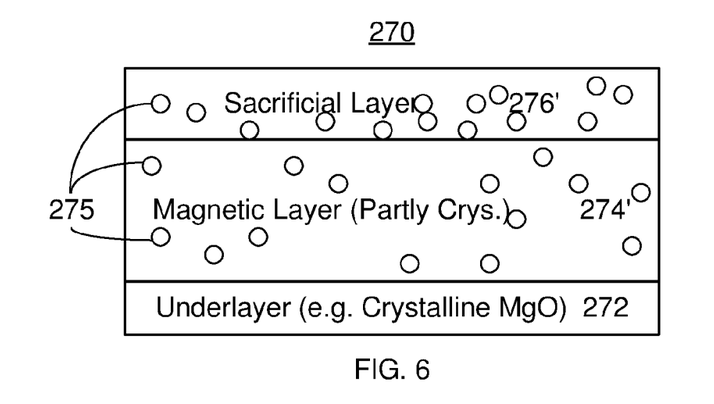
Figure 7A:
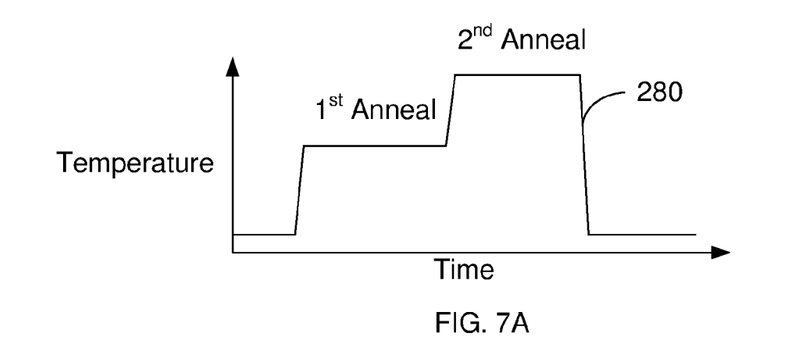
FIGS. 7A-7B depict temperature versus time for processes using two anneals.
Figure 7B:
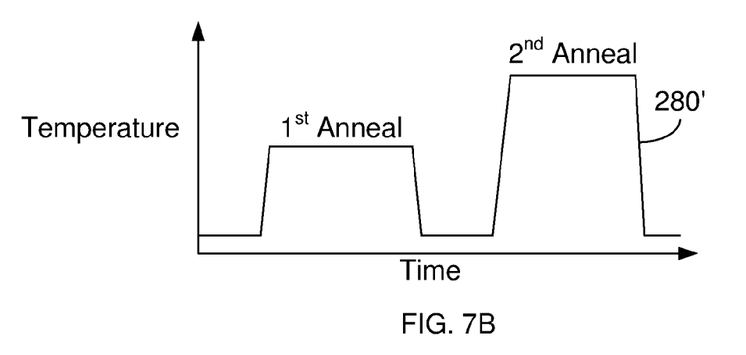

FIG. 6 depicts the portion of the magnetic junction 270 after step 126 is performed. The magnetic layer 274' is at least partially crystallized after the first anneal. Thus, some of the nonmagnetic glass-promoting component 275 has moved in to the sacrificial layer 276'. The first anneal performed in step 126 has driven some of the glass-forming component in the magnetic layer 274' to diffuse into the sacrificial layer 276'. Diffusion may take place readily because the magnetic layer 274 is amorphous. Because of this diffusion, the magnetic layer 274' may have a reduced amount of the glass-forming component. In the example above, the CoFeB layer becomes B poor. However, a substantial amount of the glass-forming component 275 may remain in the magnetic layer 274'. Further, the magnetic layer 274' remains at least partially amorphous. In some embodiments, the magnetic layer 274' may be more than half amorphous.

A second anneal is also performed after the first anneal, via step 128. The second anneal may be an RTA and may be performed for at least ten seconds and not more than one hour. In the method 120, the sacrificial layer 276' is not removed before the second anneal. The second anneal of step 128 is at a second temperature greater than the temperature of the first anneal. The second temperature may be greater than 400 degrees Celsius and not exceeding 575 degrees Celsius. For example, for a W sacrificial layer, the second temperature of the second anneal may not exceed 575 degrees Celsius. In some such embodiments, the second temperature for the second anneal may be nominally 550 degrees Celsius for a W sacrificial layer. In contrast, for a Ta sacrificial layer, the second temperature of the second anneal may not exceed 525 degrees Celsius. For example, the second temperature of the second anneal may be 500 degrees Celsius for a Ta sacrificial layer.

FIGS. 7A and 7B depict exemplary embodiments of curves 280 and 280', respectively, indicating temperature versus time for the anneals in steps 126 and 128. As can be seen in the curve 280 of FIG. 7A, the first anneal is at a lower temperature than the second anneal. In addition, the magnetic junction 270 is not cooled between the first anneal of step 126 and the second anneal of step 128. In contrast, the curve 280' of FIG. 7B indicates that the first and second anneals are separated by a time period during which the magnetic junction 270 is cooled. In other embodiments, the temperature profile of the magnetic junction 270 may be different for steps 126 and 128.

Figure 8:
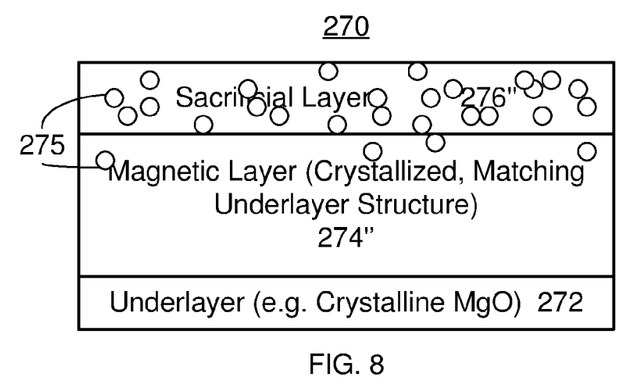
FIGS. 8-9 depict another exemplary embodiment of a magnetic layer for a magnetic junction usable in a magnetic memory and programmable using spin transfer torque during fabrication.

FIG. 8 depicts the magnetic junction 270 after step 128 is performed. The magnetic layer 274" may be fully crystallized after the second anneal. The term fully crystallized is described above. The crystal structure of the magnetic layer 274" may match that of the underlying layer 272. For example, for an FCC (100) MgO underlayer, the magnetic layer may be 75% (or 90%) BCC with a (100) orientation. The lattice parameters of the fully crystallized magnetic layer 274" and underlayer 272 may also match to within ten percent. In some embodiments, the lattice match is to within five percent. In some such embodiments, the mismatch is at least four and not more than five percent.

The second anneal may result in a fully crystallized magnetic layer 274" as defined herein. Because the crystallization due to the first anneal continues and because of the higher anneal temperature used for the second anneal, the glass-promoting component 275 may be driven to further diffuse into the sacrificial layer 276". For example, the glass-promoting component residing at defects in the lattice may obtain sufficient energy to diffuse to the sacrificial layer 276". The ongoing crystallization of the magnetic layer 274"

may prevent or reduce diffusion of the sacrificial layer 276" into the magnetic layer 274". The crystallization of the magnetic layer is thus improved. The magnetic layer 274" may also be substantially free of the glass-promoting component 275. In the example above, the CoFeB layer may now be considered a CoFe layer. In some embodiments, however, not all of the glass-promoting component 275 diffuses out of the magnetic layer 274". The percentage of the glass-promoting component 275 is significantly decreased. In the CoFeB example above, the CoFe layer resulting after the second anneal may have not more than ten atomic percent B. In some embodiments, the CoFe layer has less than five atomic percent B after the second anneal.

Figure 9:
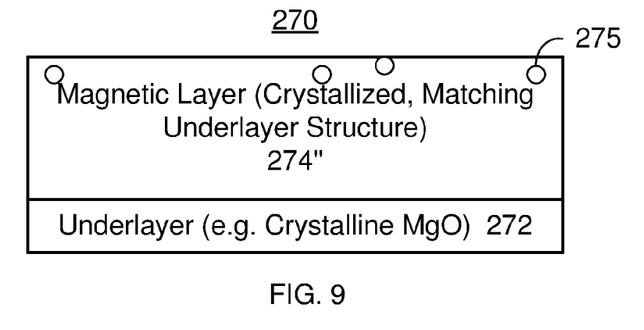

The sacrificial layer 276" is also removed, via step 130. Step 130 may include performing a plasma treatment that etches the sacrificial layer 276". FIG. 9 depicts the portion of the magnetic junction 270 after step 130 is performed. Thus, the fully crystallized magnetic layer 274" remains. Although a small amount of the glass-promoting component 275 remains, in other embodiments, the glass-promoting component may fully diffuse into the sacrificial layer 276" during the second anneal or may be removed when the sacrificial layer is removed in step 130.

The magnetic junction 270 formed using the method 120 may have improved performance. Use of the sacrificial insertion layer 276/276'276" and multiple anneals in steps 126 and 128 may allow for improved crystallization of the magnetic layer 274". The fully crystallized magnetic layer 274" may thus have a larger fraction of the layer crystallized and may have a crystal structure that more fully matches that of the underlayer 272. For example, a larger fraction of the magnetic layer 274" on a crystalline (100) oriented MgO underlayer 272 may be BCC with a (100) orientation. In addition, the lattice parameters of the layers 272 an 274" may be better matches. Further, the anneals of steps 126 and 128 may reduce or prevent diffusion of the material(s) in the sacrificial layer 276/276'/276" from significantly diffusing into the magnetic layer 274/274'/274". The interface between the layers 274" and 272 may be substantially undisturbed by diffusion of material(s) in the sacrificial layer 276. Thus, the free layer and/or pinned layer(s) incorporating the magnetic layer 274" may have improved crystallization and interfaces with the underlayer 272. The magnetic layer 274" may also have a high perpendicular magnetic anisotropy such that the perpendicular magnetic anisotropy energy exceeds the out-of-plane demagnetization energy. Consequently, the magnetic junction 270 formed using the method 120 may have a higher magnetoresistance. Performance may thus be improved.

Figure 10:
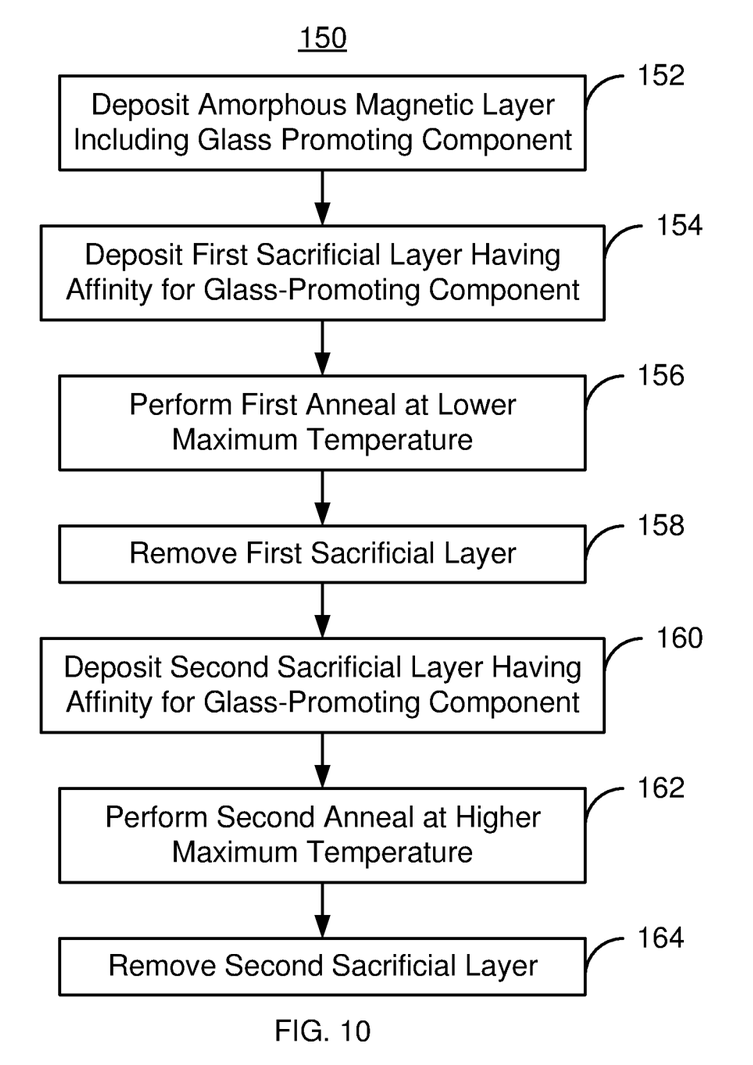
FIG. 10 depicts another exemplary embodiment of a method for providing a magnetic layer for a magnetic junction usable in a magnetic memory and programmable using spin transfer torque.

FIG. 10 depicts an exemplary embodiment of a method 150 for fabricating a portion of a magnetic junction usable in a magnetic device such as a STT-RAM and, therefore, in a variety of electronic devices. For simplicity, some steps may be omitted, performed in another order and/or combined. Further, the method 150 may start after other steps in forming a magnetic memory have been performed. The method 150 may be used in performing the step 102, 104 and/or 108 of the method 100. However, in other embodiments, the method 150 may be used in fabricating another portion of the magnetic junction 200, and/or may be used in connection with another fabrication process. FIGS. 11-16 depict exemplary embodiments of a portion of the magnetic junction 290 being fabricated. For clarity, FIGS. 11-16 are not to scale.

Referring to FIGS. 10-16, the method 150 may start after other layer(s), such as seed layer(s), nonmagnetic spacer layer(s) or other layers have been formed. For example, in one embodiment, the method 150 commences after a crystalline MgO seed layer having a (100) orientation has been deposited or after a crystalline MgO tunneling barrier layer has been formed.

A magnetic layer including at least one glass-promoting component is provided, via step 152. Step 152 is analogous to step 122 of the method 120. The magnetic layer is amorphous as-deposited. A single glass-promoting component is described herein. However, multiple glass-promoting components may be used in other embodiments. For example, a CoFeB layer, for which B is the glass-promoting component, may be deposited.

A first sacrificial layer is deposited on the magnetic layer, via step 154. Step 154 is analogous to step 124. The sacrificial layer has a high affinity for the glass-promoting component. For the magnetic layer in the example above, Ta and W have a high affinity for the glass-promoting component B. The sacrificial layer may thus include Ta and/or W. In some embodiments, the sacrificial layer may consist of Ta. In other embodiments, the sacrificial layer may consist of W. In other embodiments, the sacrificial layer may include but not be limited to one or more of the following: Hf, Rb, Sc, Zr, Nb, Mg, V, Mn, Ag, Be, Mo, Ti, Cr, Al, and Te.

Figure 11:
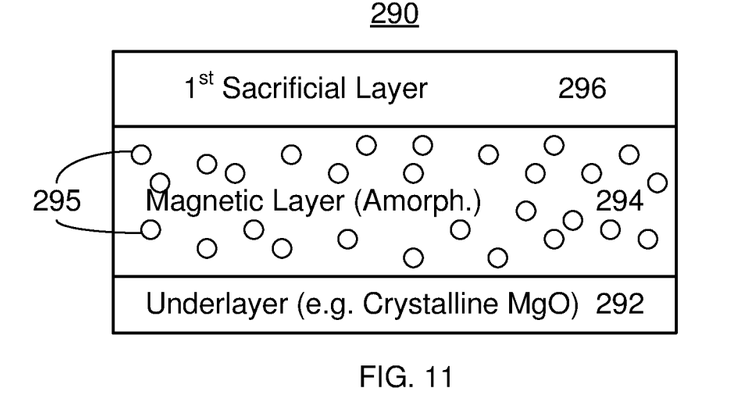
FIGS. 11-16 depict another exemplary embodiment of a magnetic layer for a magnetic junction usable in a magnetic memory and programmable using spin transfer torque during fabrication.

FIG. 11 depicts the portion of the magnetic junction 290 being formed using the method 150 after step 154 is performed. Thus, the magnetic layer 294 and sacrificial layer 296 are shown. The magnetic layer 294 resides on an underlayer 292. The magnetic layer is amorphous as-deposited and includes glass-promoting component 295. The layers 292, 294 and 296 are analogous to the layers 272, 274 and 276, described above. Thus, the materials and thicknesses of the layers 292, 294 and 296 are analogous to those described above for the layers 272, 274 and 276, respectively.

A first anneal is performed at a first temperature of greater than 200 degrees Celsius and not exceeding 475 degrees Celsius, via step 156. Step 156 is analogous to step 126. Thus, the temperatures used for and other aspects of step 156 are analogous to those described above for step 126. In some embodiments, the first temperature is not less than 300 degrees Celsius. The first anneal may be an RTA and may be performed for at least ten seconds and not more than one hour.

Figure 12:
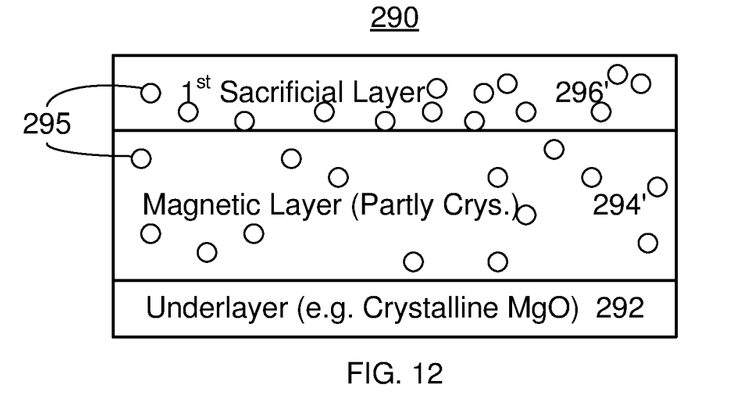

FIG. 12 depicts the portion of the magnetic junction 290 after step 156 is performed. The magnetic layer 294' is at least partially crystallized after the first anneal. Thus, some of the nonmagnetic glass-promoting component 295 has moved in to the sacrificial layer 296'. In the example above, the CoFeB layer becomes B poor. However, a substantial amount of the glass-forming component 295 may remain in the magnetic layer 294'. The magnetic layer 294' remains at least partially amorphous. In some embodiments, the magnetic layer 294' may be more than half amorphous. Thus, the layers 294' and 296' are analogous to the layers 274' and 276' described above.

Figure 13:
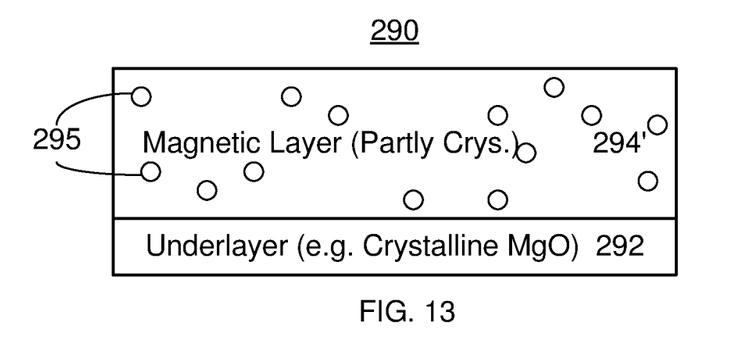

The first sacrificial layer 296' is removed, via step 158. In some embodiments, step 158 utilizes a plasma treatment. FIG. 13 depicts the portion of the magnetic junction 290 after step 158 is performed. Thus, the sacrificial layer 296' is not present.

A second sacrificial layer is provided, via step 160. Step 160 is analogous to step 154 and step 124. The second sacrificial layer has a high affinity for the glass-promoting component. For the magnetic layer in the example above, Ta and W have a high affinity for the glass-promoting component B. The sacrificial layer may thus include Ta and/or W.

Figure 14:
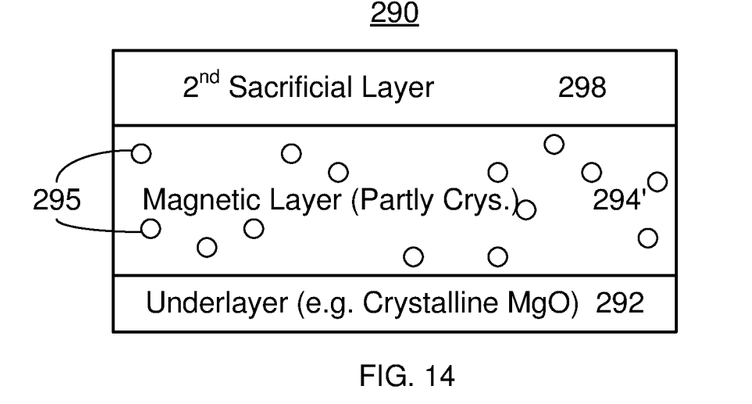

In some embodiments, the second sacrificial layer may consist of Ta. In other embodiments, the sacrificial layer may consist of W. In other embodiments, the sacrificial layer may include but may not be limited to one or more of the following: Hf, Rb, Sc, Zr, Nb, Mg, V, Mn, Ag, Be, Mo, Ti, Cr, Al, and Te. FIG. 14 depicts a portion of the magnetic junction 290 after step 160 is performed. Thus, the second sacrificial layer 298 is shown. The second sacrificial layer 298 is analogous to the first sacrificial layer 296.

A second anneal is also performed after the first anneal, after the first sacrificial layer 296' is removed and after the second sacrificial layer 298 is provided, via step 162. Step 162 is analogous to step 128. Steps 158 and 160 are performed between two anneals. For example, the first sacrificial layer 276' may be removed and the second sacrificial layer deposited at a lower temperature portion of the curve 280' depicted in FIG. 7B. Referring back to FIGS. 10-16, the second anneal may be an RTA and may be performed for at least ten seconds and not more than one hour. The second anneal of step 162 is at a second temperature greater than the temperature of the first anneal. Thus, the temperature profile and other aspects of the anneal performed in step 162 may be analogous to that described above for step 128.

Figure 15:
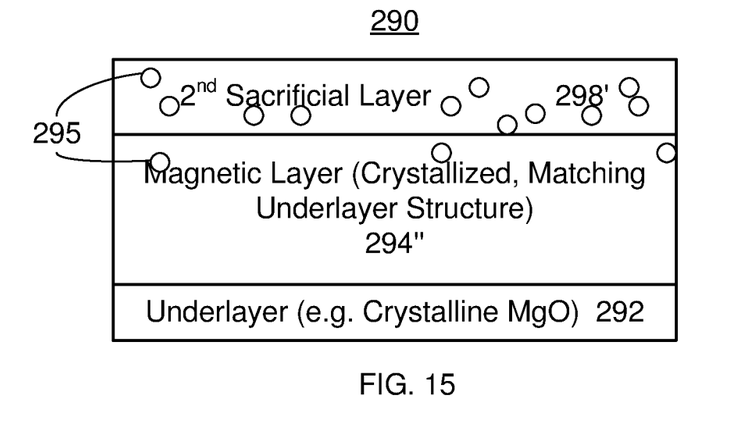

FIG. 15 depicts the magnetic junction 290 after step 162 is performed. The magnetic layer 294" may be fully crystallized after the second anneal. The term fully crystallized is described above. The magnetic layer 294" is thus analogous to the magnetic layer 274" described above. The crystal structure of the magnetic layer 274" may match that of the underlying layer 272. The lattice parameters of the fully crystallized magnetic layer 274" and underlayer 272 may also match to within ten percent. Because the crystallization due to the first anneal continues and because of the higher anneal temperature used for the second anneal, the glass-promoting component 295 may be driven to further diffuse into the second sacrificial layer 298'. The ongoing crystallization of the magnetic layer 294" may prevent or reduce diffusion of the sacrificial layer 298' into the magnetic layer 294". The crystallization of the magnetic layer is thus improved. The magnetic layer 294" may also be substantially free of the glass-promoting component 295. In the example above, the CoFeB layer may not be considered a CoFe layer. In some embodiments, however, not all of the glass-promoting component 295 diffuses out of the magnetic layer 294". The percentage of the glass-promoting component 295 is significantly decreased. In the CoFeB example above, the CoFe layer resulting after the second anneal may have less than five atomic percent B.

Figure 16:
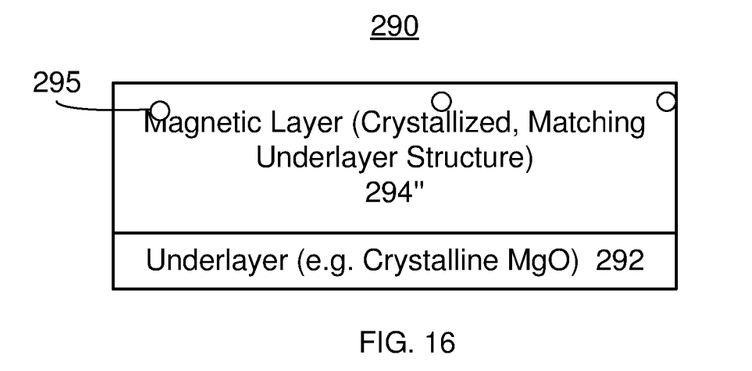

The second sacrificial layer 298 is also removed, via step 164. Step 164 may include performing a plasma treatment that etches the second sacrificial layer 298. Step 164 is analogous to step 130. FIG. 16 depicts the portion of the magnetic junction 290 after step 164 is performed. Thus, the fully crystallized magnetic layer 294" remains. A small amount of the glass-promoting component 295 remains. In other embodiments the glass-promoting component may fully diffuse into the sacrificial layer 296" during the second anneal or may be removed when the sacrificial layer is removed in step 164.

The magnetic junction 290 formed using the method 150 may have improved performance. Use of the sacrificial insertion layers 296/296' and 298/298' in conjunction with multiple anneals in steps 156 and 162 may allow for improved crystallization of the magnetic layer 294". The fully crystallized magnetic layer 294" may thus have a larger fraction of the layer crystallized and may have a crystal structure that more fully matches that of the underlayer 292. For example, a larger fraction of the magnetic layer 294" on a crystalline (100) oriented MgO underlayer 292 may be BCC with a (100) orientation. In addition, the lattice parameters of the layers 292 an 294" may be better matches. Further, the anneals of steps 156 and 162 may reduce or prevent diffusion of the material(s) in the sacrificial layer 296/296' and 298/298' from significantly diffusing into the magnetic layer 294/294'/294". The interface between the layers 294" and 292 may be substantially undisturbed by diffusion of material(s) in the sacrificial layers 296 and 298. Thus, the free layer and/or pinned layer(s) incorporating the magnetic layer 294" may have improved crystallization and interfaces with the underlayer 292. The magnetic layer 294" may also have a high perpendicular magnetic anisotropy such that the perpendicular magnetic anisotropy energy exceeds the out-of-plane demagnetization energy. Consequently, the magnetic junction 290 formed using the method 150 may have a higher magnetoresistance. Performance may thus be improved.

Figure 17:
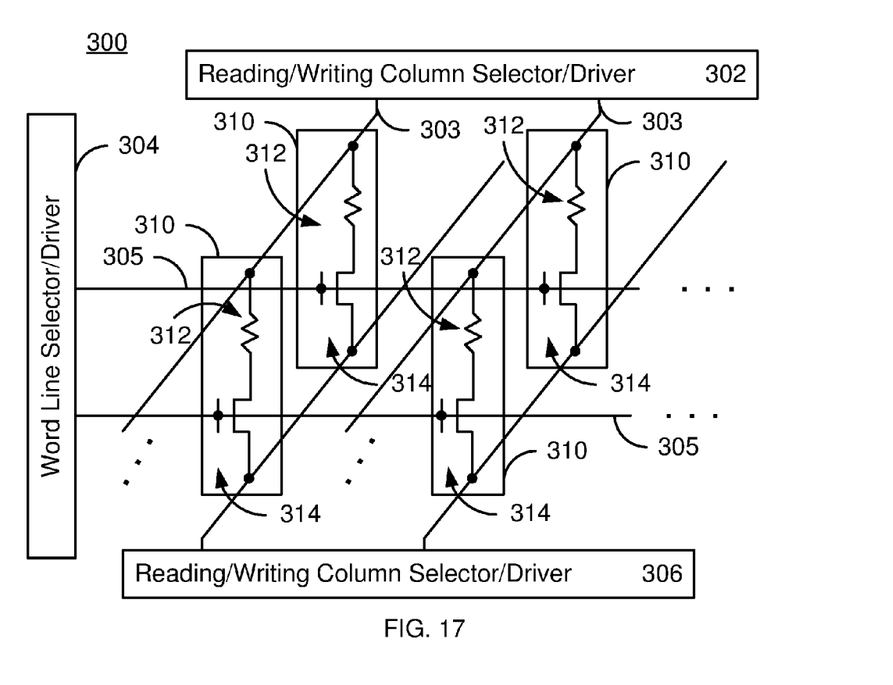
FIG. 17 depicts an exemplary embodiment of a memory utilizing magnetic junctions in the memory element(s) of the storage cell(s).

FIG. 17 depicts an exemplary embodiment of a memory 300 that may use one or more of the magnetic junction(s) 200, 270 and/or 290. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may include the magnetic junction(s) 200, 270 and/or 290 disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction on a substrate usable in a magnetic device, the method comprising:
   providing a free layer, the free layer being switchable between a plurality of stable magnetic states when a write current is passed through the magnetic junction;
   providing a nonmagnetic spacer layer;
   providing a pinned layer, the nonmagnetic spacer layer residing between the pinned layer and the free layer; and
   wherein at least one of the step of providing the free layer and the step of providing the pinned layer includes
      depositing a magnetic layer including a glass-promoting component, the magnetic layer being amorphous as-deposited;
      depositing a sacrificial layer on the magnetic layer;
      performing a first anneal of the magnetic layer and the sacrificial layer at a first temperature greater than 300 degrees Celsius and not more than 475 degrees Celsius, the magnetic layer being at least partially crystallized after the first anneal;

performing a second anneal of the magnetic layer and the sacrificial layer after the first anneal, the second anneal being at a second temperature greater than the first temperature; and removing the sacrificial layer.

2. The method of claim 1 wherein the second temperature is greater than 400 degrees Celsius and not more than 575 degrees Celsius.

3. The method of claim 1 wherein the glass-promoting component includes B.

4. The method of claim 3 wherein the sacrificial layer includes at least one of Ta, Hf, Rb, Sc, Zr, Nb, Mg, V, Mn, Ag, Be, Mo, Ti, Cr, Al, Te and W.

5. The method of claim 4 wherein the sacrificial layer is at least two Angstroms thick and not more than ten Angstroms thick.

6. The method of claim 3 wherein the magnetic layer is selected from a CoFeB layer and a FeB layer.

7. The method of claim 6 wherein the magnetic layer is a body-centered cubic layer having a (100) orientation.

8. The method of claim 1 wherein the step of removing the sacrificial layer is performed before the step of performing the second anneal and after the step of performing the first anneal the at least one of the step of providing the free layer, the step of providing the at least one of the free layer and the pinned layer further includes providing an additional sacrificial layer after the step of removing the sacrificial layer and before the step of performing the second anneal.

9. The method of claim 1 wherein the step of providing the nonmagnetic spacer layer further includes:

depositing an MgO tunneling barrier layer.

10. The method of claim 1 wherein the at least one of the step of providing the free layer and the step of providing the pinned layer includes:

cooling the magnetic layer and the sacrificial layer to a temperature less than 200 degrees Celsius after the first anneal and before the second anneal.

11. The method of claim 1 further comprising:

providing an additional nonmagnetic spacer layer, the free layer being between the additional nonmagnetic spacer layer and the nonmagnetic spacer layer; and providing an additional pinned layer, the additional nonmagnetic spacer layer being between the additional pinned layer and the free layer.

12. The method of claim 11 wherein the step of providing the additional pinned layer further includes depositing an additional magnetic layer including an additional glass-promoting component, the additional magnetic layer being amorphous as-deposited;

depositing an additional sacrificial layer on the additional magnetic layer, the additional sacrificial layer being selected from Ta, Hf, Rb, Sc, Zr, Nb, Mg, V, Mn, Ag, Be, Mo, Ti, Cr, Al, Te and W, the additional sacrificial layer having a thickness of at least two Angstroms and not more than ten Angstroms;

performing a third anneal of the additional magnetic layer and the additional sacrificial layer at a third temperature greater than 300 degrees Celsius and not more than 475 degrees Celsius;

performing a fourth anneal of the additional magnetic layer and the additional sacrificial layer after the third anneal, the fourth anneal being at a fourth temperature greater than the third temperature, the fourth temperature being greater than 400 degrees Celsius and not more than 575 degrees Celsius; and removing the additional sacrificial layer.

13. A method for providing a magnetic junction on a substrate usable in a magnetic device, the method comprising:

providing a free layer, the free layer being switchable between a plurality of stable magnetic states when a write current is passed through the magnetic junction;

providing a crystalline MgO tunneling barrier layer;

providing a pinned layer, the crystalline MgO tunneling barrier layer residing between the pinned layer and the free layer; and wherein at least one of the step of providing the free layer and the step of providing the pinned layer includes depositing an amorphous magnetic layer, the amorphous magnetic layer being selected from a CoFeB layer and a FeB layer, the amorphous magnetic layer including a glass-promoting component and being amorphous as-deposited, the glass promoting component being B;

depositing a sacrificial layer on the amorphous magnetic layer, the sacrificial layer being selected from a Ta layer and a W layer;

performing a first rapid thermal anneal (RTA) of the magnetic layer and the sacrificial layer at a first temperature greater than 300 degrees Celsius and not more than 475 degrees Celsius, the magnetic layer being at least partially crystallized after the first anneal;

performing a second RTA of the magnetic layer and the sacrificial layer after the first RTA, the second RTA being at a second temperature greater than the first temperature, the second temperature being greater than 400 degrees Celsius and not more than 575 degrees Celsius; and performing a plasma treatment to remove the sacrificial layer.

* * * * *